(12) United States Patent
Blemberg et al.

(10) Patent No.: US 11,945,331 B2
(45) Date of Patent: Apr. 2, 2024

(54) BATTERY MODULE PARALLEL SWITCHING DEVICE SYSTEMS AND METHODS

(71) Applicant: CPS Technology Holdings LLC, New York, NY (US)

(72) Inventors: Michael R Blemberg, Shorewood, WI (US); Ronald J. Dulle, Mequon, WI (US); Mark R. Johnson, Milwaukee, WI (US); Bryan L. Thieme, Colgate, WI (US)

(73) Assignee: CPS Technology Holdings LLC, New York, NY (US)

( * ) Notice: Subject to any disclaimer, the term of this patent is extended or adjusted under 35 U.S.C. 154(b) by 0 days.

(21) Appl. No.: 17/891,937

(22) Filed: Aug. 19, 2022

(65) Prior Publication Data

US 2023/0020364 A1    Jan. 19, 2023

Related U.S. Application Data

(63) Continuation of application No. 16/338,916, filed as application No. PCT/US2017/058353 on Oct. 25, 2017, now Pat. No. 11,427,105.

(Continued)

(51) Int. Cl.
*B60L 58/10* (2019.01)
*B60L 50/64* (2019.01)
(Continued)

(52) U.S. Cl.
CPC .............. *B60L 58/10* (2019.02); *B60L 50/64* (2019.02); *H02J 7/0029* (2013.01);
(Continued)

(58) Field of Classification Search
CPC ....................................................... B60L 58/10
(Continued)

(56) References Cited

U.S. PATENT DOCUMENTS

| 5,796,175 A * | 8/1998 | Itoh ......................... H02J 9/06 307/64 |
| 2003/0193770 A1* | 10/2003 | Chung ................... H01H 9/542 361/118 |

(Continued)

FOREIGN PATENT DOCUMENTS

| CN | 1701482 A | 11/2005 |
| CN | 102414766 A | 4/2012 |

(Continued)

OTHER PUBLICATIONS

International Search Report and Written Opinion for PCT Application No. PCT/US2017/058353 dated Feb. 5, 2018; 14 pages.

(Continued)

*Primary Examiner* — Jerry D Robbins
(74) *Attorney, Agent, or Firm* — Boardman & Clark LLP

(57) ABSTRACT

The present disclosure includes an automotive battery system that uses switching devices to increase operational performance and reliability. The battery system includes a battery cell, a primary switching device electrically coupled to a terminal of the battery cell, and a secondary switching device electrically coupled to the terminal of the battery cell and in parallel with the primary switching device. The primary switching device includes an electromechanical switching device that enables charging or discharging of the battery and generates a boosted voltage. A secondary switching device includes a solid-state switching device and a diode, electrically coupled in series, which detect short circuit conditions in a power-efficient manner and remove the short circuit condition by using the boosted voltage to actuate the armature. Furthermore, parallel switching (Continued)

devices work together to deliver appropriate amounts of power as required by an electrical device, increasing the performance, reliability, and life-span of a battery system.

18 Claims, 8 Drawing Sheets

Related U.S. Application Data

(60) Provisional application No. 62/412,735, filed on Oct. 25, 2016.

(51) Int. Cl.
*H02J 7/00* (2006.01)
*H02J 7/14* (2006.01)
*H02J 7/24* (2006.01)
*G01R 31/52* (2020.01)

(52) U.S. Cl.
CPC .......... *H02J 7/1446* (2013.01); *H02J 7/243* (2020.01); *G01R 31/52* (2020.01); *H02J 7/00304* (2020.01); *H02J 2207/20* (2020.01)

(58) Field of Classification Search
USPC .......................................... 322/28
See application file for complete search history.

(56) References Cited

U.S. PATENT DOCUMENTS

| | | | | |
|---|---|---|---|---|
| 2008/0094771 A1* | 4/2008 | Messersmith | .......... | H01H 9/542 361/100 |
| 2013/0257062 A1* | 10/2013 | Sakakibara | ............ | B60R 16/03 290/38 R |
| 2015/0349518 A1* | 12/2015 | Kuhla | .................... | H01H 9/542 361/23 |
| 2016/0094056 A1 | 3/2016 | Dulle | | |
| 2016/0203900 A1* | 7/2016 | Bourne | ................ | H01H 47/325 361/152 |
| 2017/0268449 A1* | 9/2017 | Nagata | ................... | F02M 61/16 |

FOREIGN PATENT DOCUMENTS

| | | |
|---|---|---|
| CN | 102640336 A | 8/2012 |
| CN | 202917401 U | 5/2013 |
| CN | 103828186 A | 5/2014 |
| CN | 105580101 A | 5/2016 |
| JP | 2011254650 A | 12/2011 |
| WO | 2005013455 A1 | 2/2005 |

OTHER PUBLICATIONS

Zhicong Luo, et. al., "Design and Application of a Highly Reliable Short-Circuit Protection Circuit", Electronic Design Engineering, 2010-10-50.

Qiang Xiao, et. al., "A Low-Threshold Voltage Comparator Based on Wilson Current Mirror", Microelectronics, Apr. 20, 2011.

* cited by examiner

BATTERY MODULE PARALLEL SWITCHING DEVICE SYSTEMS AND METHODS

CROSS REFERENCE TO RELATED APPLICATIONS

This application is a continuation of U.S. application Ser. No. 16/338,916, entitled "BATTERY MODULE PARALLEL SWITCHING DEVICE SYSTEMS AND METHODS," filed Apr. 2, 2019, U.S. Pat. No. 11,427,105; which is a U.S. National Stage Application under 35 U.S.C. § 371 of International Application No. PCT/US17/058353, entitled "BATTERY MODULE PARALLEL SWITCHING DEVICE SYSTEMS AND METHODS," filed Oct. 25, 2017, which claims priority to and the benefit of U.S. Provisional Patent Application No. 62/412,735, entitled "BATTERY MODULE PARALLEL SWITCHING DEVICE SYSTEMS AND METHODS," filed Oct. 25, 2016, which are each incorporated herein by reference in their entireties for all purposes.

BACKGROUND

The present disclosure generally relates to battery systems and, more particularly, to switching devices implemented in battery systems.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electrical systems often include a battery system to capture (e.g., store) generated electrical energy and/or to supply electrical power. In fact, battery systems may be included in electrical systems utilized for various applications. For example, a stationary power system may include a battery system that receives electrical power output by an electrical generator and stores the electrical power as electrical energy. In this manner, the battery system may supply electrical power to electrical loads using the stored electrical energy.

Additionally, an electrical system in an automotive vehicle may include a battery system that supplies electrical power, for example, to provide and/or supplement the motive force (e.g., power) of the automotive vehicle. For the purpose of the present disclosure, such automotive vehicles are referred to as xEV and may include any one, any variation, and/or any combination of the following types of automotive vehicles. For example, electric vehicles (EVs) may utilize a battery-powered electric propulsion system (e.g., one or more electric motors) as the primary source of vehicular motive force. As such, a battery system in an electric vehicle may be implemented to supply electrical power to the battery-powered electric propulsion system. Additionally, hybrid electric vehicles (HEVs) may utilize a combination of a battery-powered electric propulsion system and an internal combustion engine propulsion system to produce vehicular motive force. As such, a battery system may be implemented to facilitate directly providing at least a portion of the vehicular motive force by supplying electrical power to the battery-powered electric propulsion system.

Micro-hybrid electric vehicles (mHEVs) may use an internal combustion engine propulsion system as the primary source of vehicular motive force, but may utilize the battery system to implement "Stop-Start" techniques. In particular, a mHEV may disable its internal combustion engine while idling and crank (e.g., restart) the internal combustion engine when propulsion is subsequently desired. To facilitate implementing such techniques, the battery system may continue supplying electrical power while the internal combustion engine is disabled and supply electrical power to crank the internal combustion engine. In this manner, the battery system may indirectly supplement providing the vehicular motive force.

To facilitate controlling its operation, a battery system often includes a switching device electrically coupled to a battery (e.g., battery module, battery pack, or battery cell) in the battery system. For example, when electrically coupled between the battery and an electrical device, charging and/or discharging of the battery may be controlled by controlling the position of the switching device. In some instances, multiple different types of switching devices may be suitable for implementation in a battery system. However, at least in some instances, different types of switching devices often present varying tradeoffs, for example, that affect operational reliability and/or power consumption associated with a battery system.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, an automotive vehicle includes a battery cell, a primary switching device electrically coupled to a terminal of the battery cell, and a secondary switching device electrically coupled to the terminal of the battery cell such that it is electrically parallel with the primary switching device. The primary switching device includes an electromechanical switching device that, when in a first closed position, enables current flow in a first direction through the primary switching device to facilitate charging of the battery cell or enables current flow in a second direction through the primary switching device to facilitate discharging the battery cell. Additionally, the secondary switching device includes a solid-state switching device and a diode, which is electrically coupled in series with the solid-state switching device. The diode enables current to flow, when the solid-state switching device is in a second closed position, in only one of the first direction and the second direction through the secondary switching device.

In another embodiment, a method for implementing an automotive battery system includes implementing a battery module, which includes a plurality of battery cells, which are electrically coupled between a positive terminal and negative terminal of the battery module. The method also includes implementing an electromechanical switching device, which includes an armature and coil circuitry. The method includes implementing the coil circuitry, which includes electrically coupling a close relay coil between a high-side close transistor and a low-side close transistor to enable the close relay coil to generate a first magnetic field, when supplied power at a first voltage via the high-side close transistor, that actuates the armature. Further, implementing the coil circuitry includes electrically coupling an open relay coil between a high-side open transistor and a low-side open transistor to enable the open relay coil to generate a second magnetic field, when supplied power at a second voltage via the high-side open transistor, that actuates the armature. Furthermore, implementing the coil circuitry includes electrically coupling an anode of a first diode to the close relay coil and the low-side close transistor. Additionally, coil circuitry implementation includes electrically coupling a cathode of the first diode to a capacitor and high-side open transistor that enables electrical energy to be stored at the second voltage within a capacitor when power at the first voltage is supplied to the close relay coil.

In another embodiment, a battery module includes a positive terminal and negative terminal on the battery module's housing and a plurality of battery cells coupled in series with the negative terminal. Furthermore, the battery module includes a primary switching device and a second switching device, which are electrically coupled in parallel between the plurality of battery cells and the positive terminal of the battery module. The primary switching device includes an armature and coil circuitry, which stores electrical energy at a boosted voltage and supply electrical power at the boosted voltage to actuate the armature from a first closed position to a first open position when a short-circuit condition is detected. The second switching device also includes a solid-state switching device and a first diode that limits current flow direction through the second switching device when the solid-state switching device is in a second closed position.

BRIEF DESCRIPTION OF THE DRAWINGS

Various aspects of the present disclosure may be better understood upon reading the following detailed description and upon reference to the drawings, in which.

DETAILED DESCRIPTION

Figure 1:
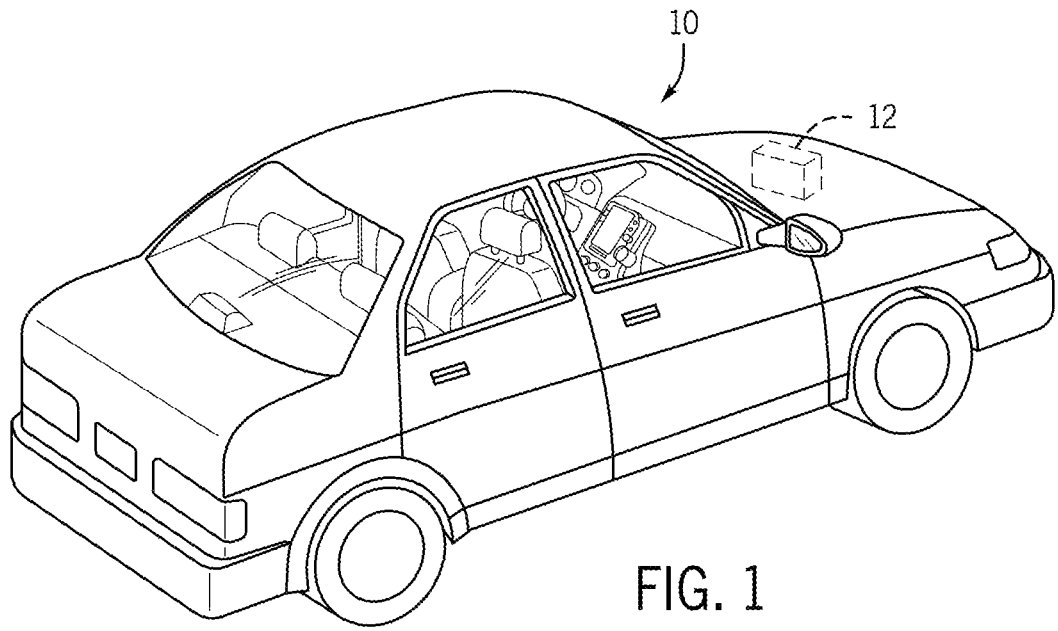
FIG. 1 is a perspective view of an automotive vehicle including a battery system, in accordance with an embodiment.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Generally, a battery systems may be implemented to capture (e.g., store) electrical energy generated by one or more electrical generators and/or to supply electrical power to one or more electrical loads using stored electrical energy. Leveraging these benefits, one or more battery systems are often included in an electrical system. In fact, battery systems may be utilized in electrical systems implemented for a wide-variety of target applications, for example, ranging from stationary power systems to vehicular (e.g., automotive) electrical systems.

In any case, to facilitate controlling its operation, a battery system often includes a switching device electrically coupled to a battery (e.g., battery module, battery pack, or battery cell) in the battery system. Thus, at least in some instances, operation (e.g., charging and/or discharging) of the battery may be controlled by controlling position of the switching device. For example, the switching device may conduct current when in a closed (e.g., connected) position, thereby enabling charging and/or discharging of the battery. On the other hand, the switching device may block current flow when in an open (e.g., disconnected) position, thereby disabling charging and/or discharging of the battery.

In some instances, multiple different types of switching devices may be suitable to facilitate providing such operational control. However, at least in some instances, different types of switching devices may present varying tradeoffs. For example, an electromechanical switching device (e.g., relay or contactor) may have a higher power (e.g., voltage and/or current) rating compared to a solid-state (e.g., semiconductor) switching device. On the other hand, a solid-state switching device may enable more granular control over conducted power compared to an electromechanical switching device. Thus, at least in some instances, type of the switching device implemented in a battery system may affect operational reliability and/or power consumption associated with the battery system.

Accordingly, the present disclosure provides techniques for implementing and/or controlling operation of switching devices in a battery system, for example, to facilitate improving operational reliability and/or reducing power consumption of the battery system. In some embodiments, the battery system may include multiple switching devices electrically coupled in parallel between terminals of a battery (e.g., battery module, battery pack, or battery cell) in the battery system. For example, the battery system may include a primary switching device and a secondary switching device electrically coupled in parallel between a (e.g., positive or negative) terminal of the battery and an electrical device (e.g., source and/or load).

To facilitate improving operational reliability and/or reducing power consumption, in some embodiments, one or more of the parallel switching devices in a battery system may be implemented using different types of switching devices. Additionally, in some embodiments, one or more of the parallel switching devices may be implemented in a battery system to facilitate controlling direction of current flow through its battery. For example, the secondary switching device may include a diode implemented to enable current flow from the battery to the electrical device, thereby enabling only discharging the battery through the secondary switching device. Alternatively, the secondary switching device may include a diode implemented to enable current flow from the electrical device to the battery, thereby enabling only charging the battery through the secondary switching device.

Furthermore, in some embodiments, one or more of the parallel switching devices may be implemented in a battery system to facilitate controlling magnitude of current flow through its battery. For example, the secondary switching device may be implemented such that, when closed, the secondary switching device limits magnitude of current flow compared to the primary switching device. In other words, in some embodiments, the primary switching device may be closed when higher magnitude current flow between the battery and the electrical device is desired (e.g., to crank an internal combustion engine) and the secondary switching device may be closed when lower magnitude current flow between the battery and the electrical devices is expected to be sufficient (e.g., to power a radio during vehicle key off). Thus, in some embodiments, the primary switching device may include an electromechanical switching device (e.g., relay or contactor) and/or the secondary switching device may include a semiconductor switching device, such as a metal-oxide-semiconductor field-effect transistor (MOSFET) or a bipolar junction transistor (BJT).

In any case, as described above, the primary switching device and the secondary switching device may be operated to control current flow between the battery and the electrical devices. In particular, when closed, the secondary switching device may enable current flow between the battery and the electrical device even when the primary switching device is open. In fact, when the primary switching device includes a hi-stable relay, the secondary switching device may facilitate maintaining the primary switching device open for extended periods of time. For example, the secondary switching device may be closed during vehicle key off, thereby enabling supply of electrical power to key off electrical loads while the primary switching device is open. In some embodiments, this may enable switching a battery control system (e.g., battery management unit) from an active mode to a sleep mode, which may facilitate reducing power consumption. Additionally, since limiting current flow, the secondary switching device may reduce likelihood of short circuit conditions affecting long-term operation (e.g., life span) of the battery, the electrical devices, the battery control system, and/or the battery system.

In fact, in some embodiments, one or more of the parallel switching devices may be implemented with circuitry that facilitates automatically detecting whether a short circuit condition is expected to be present. For example, the secondary switching device may include a current mirror branch (e.g., circuitry) electrically coupled between its solid-state switch and diode. Additionally, the secondary switching device may include short circuit protection circuitry electrically coupled between the current mirror branch and the gate of the solid-state switch. In this manner, the secondary switching device may facilitate autonomously determining whether a short circuit condition is expected to be present based at least in part on battery current and disconnecting the battery from the electrical devices when a short circuit condition is expected to be present.

Moreover, when a short circuit condition is expected to be present during vehicle key off, the secondary switching device may wake up the battery control system, for example, to perform further testing and/or diagnostics. Since limiting current flow, in some embodiments, the secondary switching device may improve accuracy of battery current determination, thereby reducing likelihood of inadvertently waking up the battery management system (e.g., false positive short circuit condition) and, thus, further facilitating reduced power consumption.

Additionally, in some embodiments, one or more of the parallel switching devices may be implemented with circuitry that facilitates determining operational parameters of the battery. For example, the secondary switching device may include a voltage measurement branch (e.g., circuitry) that facilitates determining battery voltage. Furthermore, in some embodiments, the secondary switching device may include circuitry (e.g., self-test switch) that facilitates testing short circuit detection capabilities and/or reaction of the secondary switching device to a short circuit condition. Moreover, in some embodiments, the secondary switching device may be closed while the primary switch device is open to facilitate testing (e.g., performing diagnostics). For example, during manufacturing, this may facilitate diagnostic testing operation of the primary switching device. Additionally, during shipping, this may facilitate reducing likelihood of the battery outputting high current, which may be detrimental to its surrounding environment. Furthermore, this may facilitate improving vehicle integration (e.g., at manufacturing plant or in-field) by enabling the battery to be initialized, for example, with reduced use of additional tools or devices.

As described above, in some embodiments, an electromechanical switching device may be implemented in a battery system. For example, when implemented using an electromechanical switching device, the primary switching device may include an armature and coil circuitry, which generates a magnetic field that actuates the armature to open or close the primary switching device. To facilitate improving operational reliability, in some embodiments, the coil circuitry may be implemented to generate a boosted voltage that may be stored and used to actuate the armature, for example, when a short circuit condition is present.

In particular, the coil circuitry may include a relay coil, which may be used as an inductor to facilitate storing electrical energy in a capacitor at the boosted voltage. Since the amount of electrical energy stored in a capacitor is generally based at least in part on voltage, storing electrical energy at the boosted voltage may facilitate reducing size (e.g., rating and/or physical size) of the capacitor and, thus, implementation associated costs, such as packaging and/or component cost. Moreover, in some embodiments, reducing rating may facilitate reducing leakage (e.g., quiescent) current through the capacitor, thereby reducing power consumption and/or shelf life of the battery.

As described above, in some embodiments, the boosted voltage may be used to actuate (e.g., open or close) the switching device. For example, when a short circuit condition is present, the battery voltage may drop. In some instances, the battery voltage may drop to a voltage insufficient to actuate the switching device while the boosted voltage may be sufficient to actuate the switching device. As such, actuating the switching device using the boosted voltage may improve reliability of the switching device—particularly when a short circuit condition is present. Moreover, in some embodiments, the boosted voltage may be fed back to hold up the battery voltage, for example, to power the battery management system and/or other electrical devices. In this manner, the techniques of the present disclosure may be implemented to facilitate improving operational reliability and/or reducing power consumption of a battery system and, thus, an electrical system in which the battery system is implemented.

To help illustrate, an automotive vehicle 10 with an electrical system, which includes a battery system 12, is shown in FIG. 1. Discussion with regard to the automotive vehicle 10 is merely intended to help illustrate the techniques of the present disclosure and not to limit the scope of the techniques. The automotive vehicle 10 may include the battery system 12 and an additional automotive electrical system that may control a vehicle console, an electric motor, and/or a generator. In some cases, the battery system 12 may include some or all of the automotive electrical system. For sake of discussion, the battery system 12 is electrically coupled to the automotive electrical system discussed. In some embodiments, the automotive vehicle 10 may be an xEV, which utilized the battery system 12 to provide and/or supplement vehicular motive force, for example, used to accelerate and/or decelerate the automotive vehicle 10. In other embodiments, the automotive vehicle 10 may be a traditional automotive vehicle 10 that produces vehicular motive force, for example, using an internal combustion engine to accelerate and/or frictional breaks to decelerate.

Figure 2:
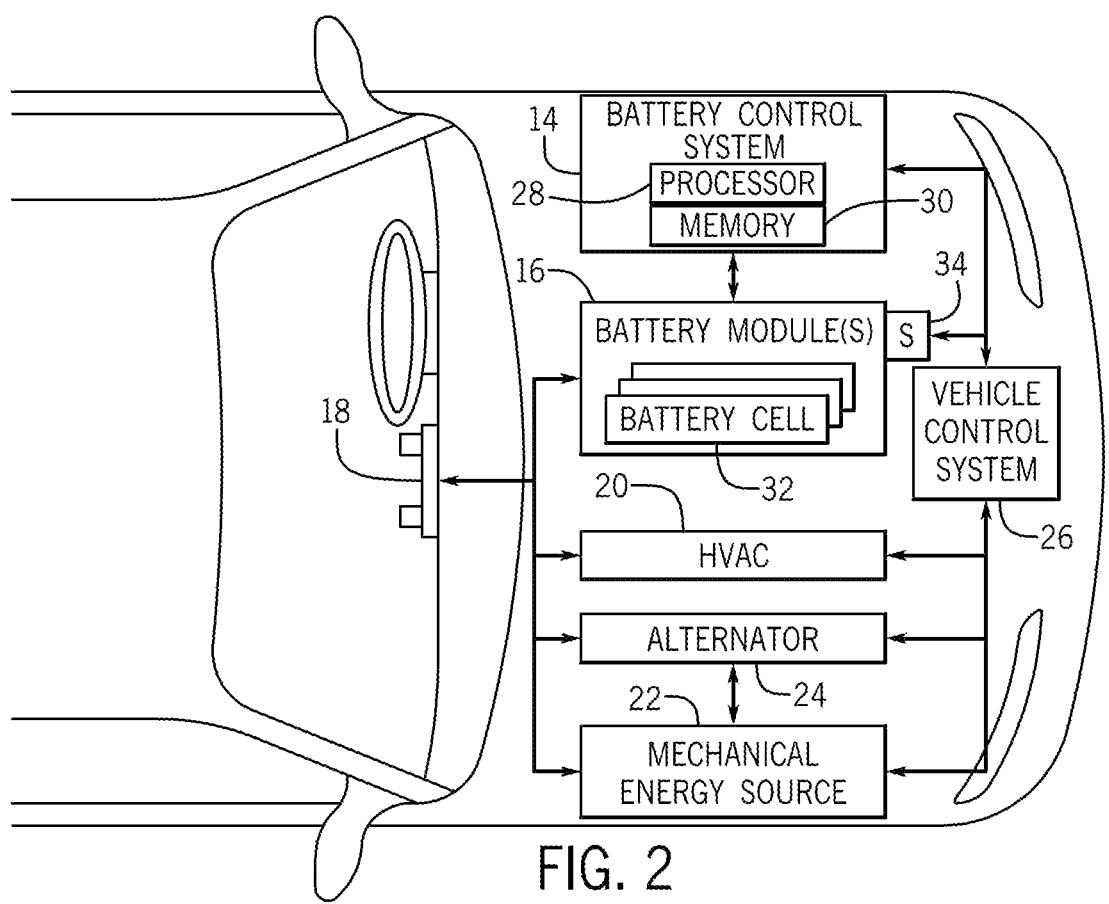
FIG. 2 is a block diagram of an electrical system including the battery system of FIG. 1, in accordance with an embodiment.

A more detailed view of the battery system 12 and the automotive electrical system in the automotive vehicle 10 is shown in FIG. 2. As illustrated, the battery system 12 includes a battery control system 14 and one or more battery modules 16. Additionally, the automotive electrical system may include a vehicle console 18 and a heating, ventilating, and air conditioning (HVAC) system 20. In some embodiments, the automotive electrical system may additionally or alternatively include a mechanical energy source 22 (e.g., an electric motor) operating in a motor mode.

Additionally, in the depicted automotive vehicle 10, the automotive electrical system may include an electrical source. As illustrated, the electrical source in this embodiment of the automotive electrical system is an alternator 24. The alternator 24 may convert mechanical energy generated by the mechanical energy source 22 (e.g., an internal combustion engine and/or rotating wheels) into electrical energy. In some embodiments, the electrical source may additionally or alternatively include the mechanical energy source 22 (e.g., an electric motor) operating in a generator mode.

As depicted, the automotive vehicle 10 includes a vehicle control system 26. In some embodiments, the vehicle control system 26 may generally control operation of the automotive vehicle 10, which includes the automotive electrical system. Thus, in the depicted automotive vehicle 10, the vehicle control system 26 may supervise the battery control system 14, the battery modules 16, the HVAC 20, the alternator 24, the vehicle console 18, and the mechanical energy source 22, making the vehicle control system 26 similar to a supervisory control system. However, the vehicle control system 26 may additionally control operation of other components other than the components of the automotive electrical system, such as an internal combustion engine propulsion system.

In some embodiments, the battery control system 14 may additionally or alternatively control operation of the battery system 12. For example, the battery control system 14 may determine operational parameters of battery modules 16, coordinate operation of multiple battery modules 16, communicate control commands instructing the battery system 12 to perform control actions, and/or communicate with the vehicle control system 26.

To facilitate controlling operation of the battery system 12, the battery control system 14 may include a processor 28 and memory 30. In some embodiments, the memory 30 may include a tangible, non-transitory, computer readable medium that stores data, such as instructions executable by the processor 28, results (e.g., operational parameters) determined by the processor 28, and/or information (e.g., operational parameters) to be analyzed/processed by the processor 28. Thus, in such embodiments, the memory 30 may include random access memory (RAM), read only memory (ROM), rewritable non-volatile memory (e.g., flash memory), hard drives, optical discs, and the like. Additionally, the processor 28 may include one or more general purpose processing units, processing circuitry, and/or logic circuitry. For example, the processor 28 may include one or more microprocessors, one or more application-specific integrated circuits (ASICs), and/or one or more field programmable logic arrays (FPGAs).

Additionally, to facilitate the storing and supplying of electrical power, the battery system 12 may include one or more battery modules 16. In some embodiments, storage capacity of the battery system 12 may be based at least in part on number of battery modules 16. Additionally, in some embodiments, operational compatibility of the battery system 12 with the automotive electrical system may be based at least in part on configuration of the battery modules 16, for example, in series and/or in parallel to operate in a target voltage domain. Accordingly, in some embodiments, implementation (e.g., number and/or configuration) of the battery modules 16 and, thus, the battery system 12 may vary based at least in part on configuration and/or target application of the automotive electrical system.

In some embodiments, the number and/or configuration of battery modules 16 of the battery system 12 may vary based at least in part on target application. For example, in the depicted automotive vehicle 10, the battery system 12 includes one battery module 16. It is noted that the battery system 12 may include multiple battery modules 16 to facilitate operational compatibility with multiple voltage domains. For example, a first battery module 16 may operate (e.g., receive and/or supply) using electrical power in a first (e.g., high or 48 volt) voltage domain. On the other hand, a second battery module, not depicted, may operate using electrical power in a second (e.g., low or 12 volt) voltage domain. In other words, in other embodiments, the battery system 12 may include two or more battery modules 16.

In any case, each battery module 16 may include one or more battery cells 32 connected in series and/or parallel with terminals (e.g., positive terminal and negative terminal) of the battery module 16. In particular, a battery cell 32 may store electrical energy and/or output electrical power via one or more electro-chemical reactions. For example, in some embodiments, the battery cells 32 may include lithium-ion battery cells, lead-acid battery cells, or both.

In some embodiments, the battery control system 14 may monitor operation of the battery module 16 via one or more sensors 34. A sensor 34 may transmit sensor data to the battery control system 14 indicative of real-time (e.g., measured) operational parameters of the battery modules 16. Thus, in some embodiments, a battery system 12 may include one or more voltage sensors, one or more temperature sensors, and/or a variety of additional or alternative sensors. For example, in the depicted embodiment, the battery control system 14 may receive sensor data from the sensor 34 indicative of the voltage (e.g., terminal voltage) of the battery module 16. The battery control system 14 may process the sensor data based on instructions stored in memory 30.

Based at least in part on battery operational parameters, in some embodiments, the battery control system 14 may execute control applications to determine the state of the battery module 16 and/or the state of the battery system 12. For example the battery control system 14 may execute a state-of-function (SoF) control application to determine a discharge current limit and/or a charge current limit based at least in part on a terminal voltage indicated by sensor data received from the sensor 34. Based on the control application, the battery control system 14 may instruct the battery system 12 to perform one or more control actions and/or operate in different manners. For example, the battery control system 14 may instruct a switching device to electrically disconnect if a determined discharge current exceeds a threshold stored in memory 30. In other words, in some embodiments, a battery system 12 may include one or more switching devices to facilitate controlling operation of its battery.

Figure 3:
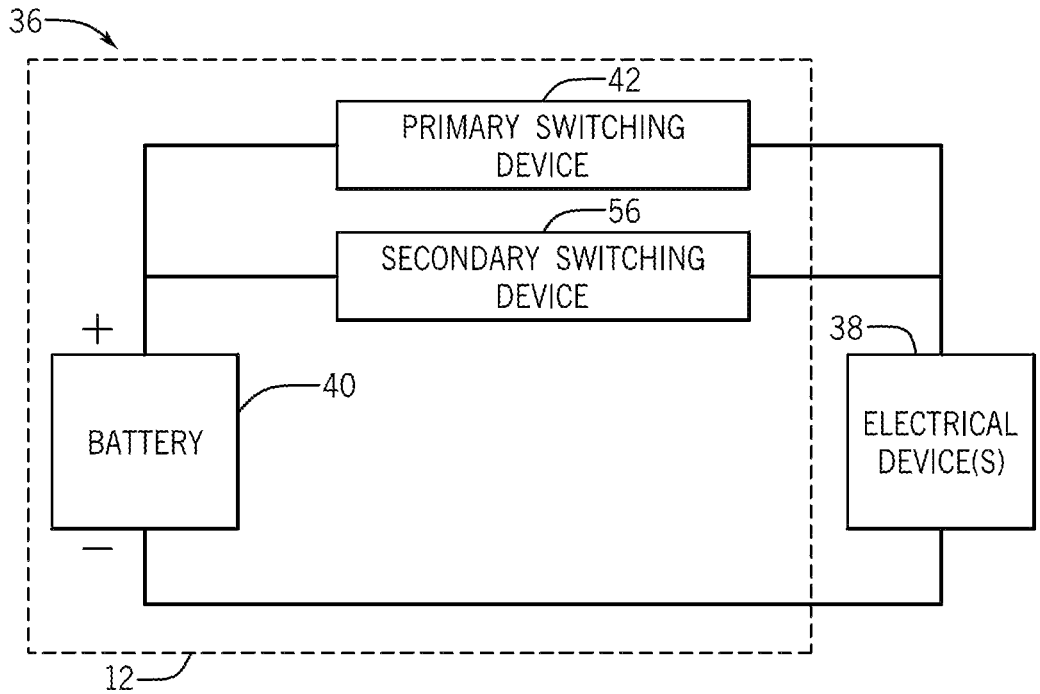
FIG. 3 is a schematic diagram of the electrical system of FIG. 2 including a primary switching device and a secondary switching device coupled in parallel, in accordance with an embodiment.

To help illustrate, an example of an electrical system 36 including, a battery system 12 and one or more electrical devices 38 is shown in FIG. 3. An electrical device 38 uses the energy provided by an electrical current and transforms it onto some other form of energy. The electrical devices 38 are usually physically isolated from and electrically coupled to the battery system 12 and may act either as a source or as a load depending on whether it provides power to or draws from the battery system 12, respectively. For example, the electrical devices 38 may include sensors 34, the HVAC system 20, and/or the vehicle console 18.

Additionally, the battery system 12 includes a battery 40, a primary switching device 42, and a second switching device 56. In some embodiments, the battery 40 may be a battery cell 32. Thus, in such embodiments, the primary switching device 42 and the secondary switching device 56 may be electrically coupled in parallel between a (e.g., positive or negative) terminal of the battery cell 32 and an electrical device 38. Additionally or alternatively, the battery 40 be a battery module 16. Thus, in such embodiments, the primary switching device 42 and the secondary switching device 56 may be electrically coupled in parallel between a battery cell 32 in the battery module 16 and a (e.g., positive or negative) terminal of the battery module 16.

In any case, the battery 40 may charge by undergoing chemical reactions between its terminals, thereby storing electrical energy within. When a load is connected appropriately to the battery 40 terminals, the chemical reaction that occurs during charging may be reversed, thereby producing a flow of electrons that may be outputted as electrical power to one or more electrical devices 38. Thus, the primary switching device 42 and/or the second switching device 56 may facilitate controlling operation (e.g., charging and/or discharging) of the battery 40.

As described above, different types of switching devices may be implemented in a battery system 12. In fact, to facilitate improving operational reliability and/or operational efficiency, the primary switching device 42 and the secondary switching device 56 use different types of switching devices. For example, the secondary switching device 56 may be implemented using a solid-state (e.g., semiconductor) switching device and the primary switching device 42 may be implemented using an electromechanical switching, device.

Figure 4:
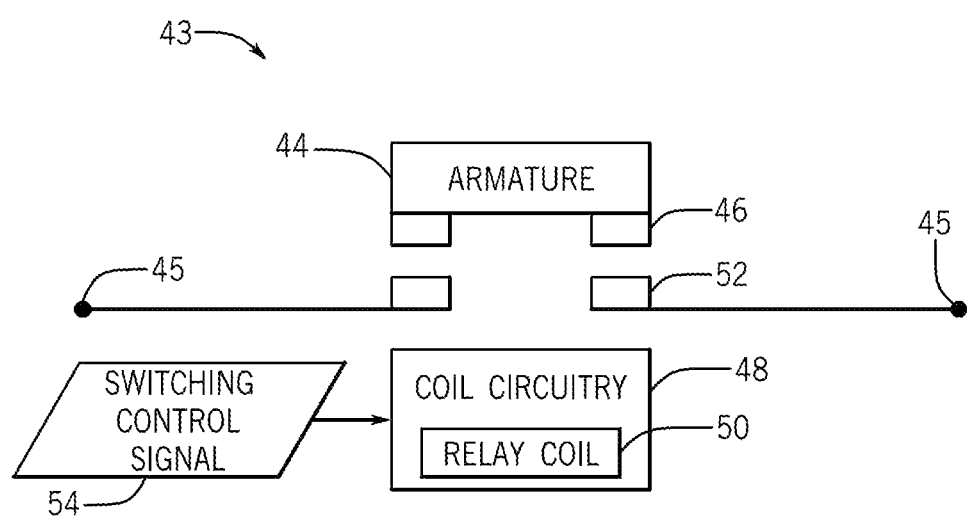
FIG. 4 is a schematic diagram of the primary switching device of FIG. 3 including coil circuitry, in accordance with an embodiment.

To help illustrate, an example of an electromechanical switching device 43, which may be implemented as a primary switching device 42 or as a standalone switching device, is shown in FIG. 4. As depicted, the electromechanical switching device 43 includes movable contacts 46 formed on an armature 44 and stationary contacts 52 formed on terminals 45 of the electromechanical switching device 43. Additionally, the electromechanical switching device 43 includes coil circuitry that facilitates controlling operation of the electromechanical switching device 43 by actuating the armature 44, for example, to electrically connect and/or disconnect the stationary contacts 52 and the movable contacts 46.

To facilitate actuating the armature, the coil circuitry 48 may include one or more relay coils 50 that generate magnetic fields based at least in part on switching control signals 54, for example, received from a battery control system 14. For example, a switching control signal 54 may instruct the coil circuitry 48 to supply electrical power to a relay coil 50 that causes the relay coil 50 to generate a magnetic field, which attracts the armature 44 to transition the electromechanical switching device 43 from an open position to a closed position.

Returning to FIG. 3, as described above, the secondary switching device 56 may be implemented using a different type of switching device than the primary switching device 42. For example, when the primary switching device 42 is implemented using an electromechanical switching device 43, the secondary switching device 56 may be implemented using a solid-state switching device 59. In some embodiments, a solid-state switching device 59 may include a solid-state (e.g, semiconductor) switch, such as a metal-oxide semiconductor field-effect transistor (MOSFET) or a bipolar junction transistor (BJT).

Figure 5:
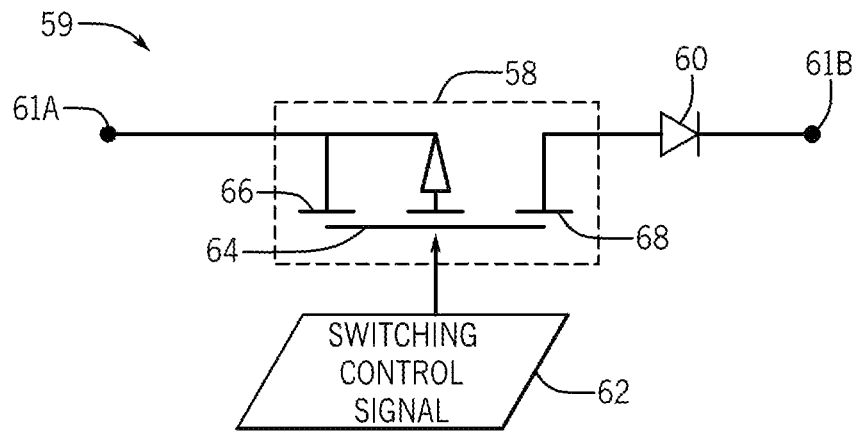
FIG. 5 is a schematic diagram of the secondary switching device of FIG. 3, in accordance with an embodiment.

To help illustrate, an example of a solid-state switching device 59, which may be implemented as the secondary switching device 56 or as a standalone switching device, is shown in FIG. 5. As depicted, the solid-state switching device 59 includes a solid-state switch 58 and a diode 60 electrically coupled between switching device terminals 61. In particular, a source 66 of solid-state switch 58 is electrically coupled to an input terminal 61A of the solid-state switching device 59 and a drain 58 of the solid-state switch 58 is electrically coupled to an anode of the diode 60. Additionally, the cathode of the diode 60 is electrically coupled to an output terminal 61B of the solid-state switching device 59.

To facilitate controlling operation of the solid-state switching device 59, a switching control signal 62 may be supplied to a gate 64 of the solid-state switch 58. In some embodiments, the solid-state switch 58 may be a positive-channel metal oxide semiconductor (PMOS). Thus, when voltage of the switching control signal 62 exceeds a threshold voltage (Vth), the solid-state switch 58 may block flow of electrical current between its source 66 and gate 68, thereby maintaining the solid-state switching device 59 in an open position. On the other hand, when voltage of the switching control signal 62 does not exceeds the threshold voltage (Vth), the solid-state switch 58 may enable flow of electrical current between its source 66 and gate 68, thereby maintaining the solid-state switching device 59 in a closed position. Moreover, by electrically coupling the solid-state switch 58 and the diode 60 in series, the solid-state switching device 59 may enable unidirectional current flow, for example, enabling only charging or only discharging depending on orientation of the diode 60.

Figure 6:
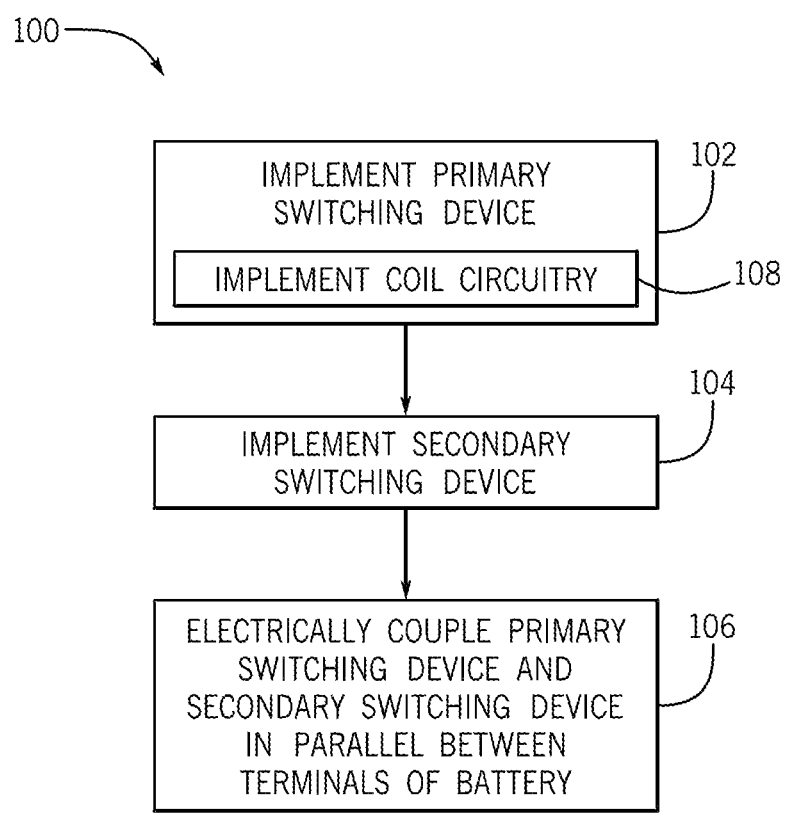
FIG. 6 is a flow diagram of a process for implementing the electrical system of FIG. 3, in accordance with an embodiment.

An example of a process 100 for implementing a battery system 12 is described in FIG. 6. Generally, the process 100 includes implementing a primary switching device 42 (process block 102), implementing a secondary switching device 56 (process block 104), and electrically coupling the primary switching device 42 and the secondary switching device 56 in parallel between terminals of a battery 40 (process block 106). In some embodiments, the process 100 may be implemented at least in part by a manufacturer of the battery system 12 and/or by a system integrator of the electrical system 36.

As described above, in some embodiments, the primary switching device 42 may be implemented using an electromechanical switching device 43 (process block 102). Additionally, as described above, an electromechanical switching device 43 may include stationary contacts 52 coupled to its terminals 45, movable contacts 46 coupled on an armature 44, and coil circuitry 48 with one or more relay coils 50, which generate magnetic fields that actuate the armature 44, for example, to open and/or close the electromechanical switching device 43. Thus, implementing the primary switching device 42 may include implementing coil circuitry 48 (process block 108).

Figure 7:
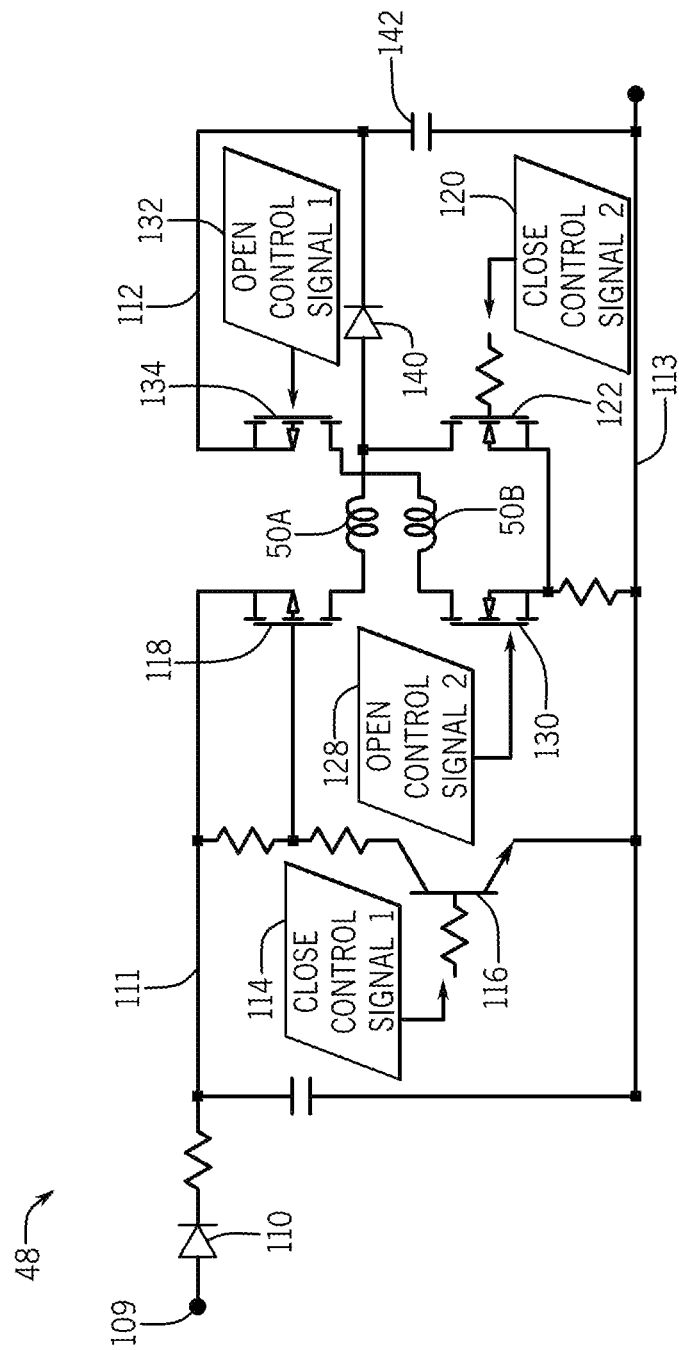
FIG. 7 is a schematic diagram of the coil circuitry of FIG. 4, in accordance with an embodiment.

To help illustrate, an example of coil circuitry 48, which may be implemented in the primary switching device 42 or a standalone electromechanical switching device 43, is shown in FIG. 7. As depicted, the coil circuitry 48 includes a diode 110 electrically coupled between an input terminal 109 and a first bus 111. Additionally, the coil circuitry 48 includes a high-side close transistor 118 electrically coupled between the first bus 111 and a close relay coil 50A, which is electrically coupled to a low-side close transistor 122. By implementing the coil circuitry 48 in this manner, a battery control system 14 may control closing of an electromechanical switching device 43 by supplying a close control signal 120 to the gate of the low-side close transistor 122 and/or by supplying a close control signal 114 to the gate of the high-side close transistor 118, for example, via a bipolar junction transistor (BJT) electrically coupled between the first bus 111 and a third bus 113, which is electrically coupled to an output terminal 115 of the coil circuitry 48.

Furthermore, the coil circuitry 48 includes a high-side open transistor 134 electrically coupled between the second bus 112 and an open relay coil 50B, which is electrically coupled to a low-side open transistor 130. By implementing the coil circuitry 48 in this manner, a battery control system 14 may control opening of an electromechanical switching device 43 by supplying an open control signal 132 to the gate of the high-side open transistor 134 and/or by supplying an open control signal 128 to the gate of the low-side open transistor 130.

Moreover, the coil circuitry 48 includes a diode 140 electrically coupled between the close relay coil 50A and the second bus 112. The coil circuitry 48 also includes a capacitor 142 electrically coupled between the second bus 112 and the third bus 113. By implementing the coil circuitry 48 in this manner, the close relay coil 50A may operate as an inductor to generate a boosted voltage, which may be stored as electrical energy in the capacitor 142, when electrical power is received from the first bus 111. To facilitate controlling generation of the boosted voltage, in some embodiments, a battery control system 14 may control switching of the low-side close transistor 122 via the close control signal 120.

Utilizing the electrical energy stored in the capacitor 142, the coil circuitry 48 may control supply of electrical power from the second bus 112 to the open relay coil 50B and, thus, opening of the electromechanical switching device 43. In other words, to facilitate controlling opening of the electromechanical switching device 43, a battery control system 14 may control switching of high-side open transistor 134 and, thus, supply of the boosted voltage to the open relay coil 50B via the open control signal 134. As described above, opening the electromechanical switching device 43 using the boosted voltage may facilitate reducing implementation associated cost of coil circuitry 48, for example, compared to using a battery 40 (e.g., lower or pre-boosted) voltage by enabling capacitance of the capacitor 142 to be reduced.

Figure 8:
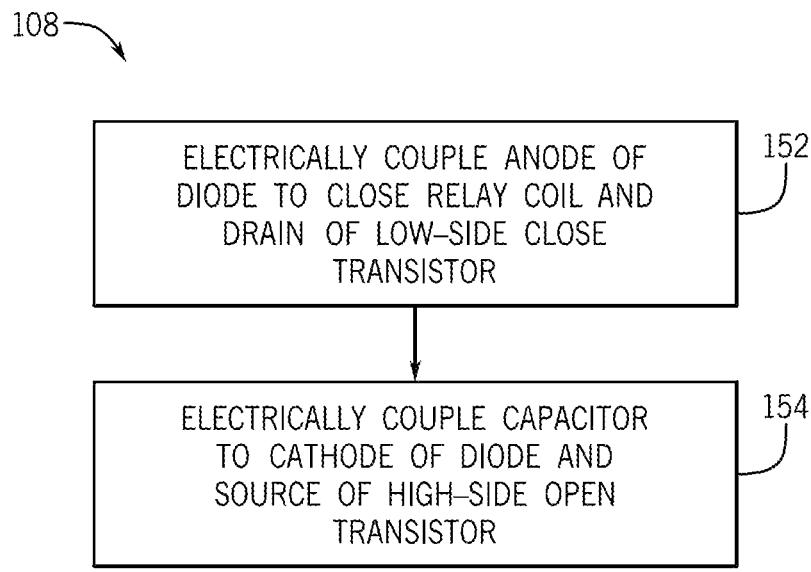
FIG. 8 is a flow diagram of a process for implementing the coil circuitry of FIG. 7, in accordance with an embodiment.

Thus, an example of a process 108 for implementing coil circuitry 48 in an electromechanical switching device 43 is shown in FIG. 8. Generally, the process includes coupling an anode of a diode 140 to a close relay coil and to a drain of a low-side close transistor (process block 152) and electrically coupling a capacitor 142 to a cathode of the diode 140 and a source of a high-side open transistor (process block 154). In some embodiments, the process 100 may be implemented at least in part by a manufacturer of the battery system 12 and/or by a system integrator of the electrical system 36.

Figure 9:
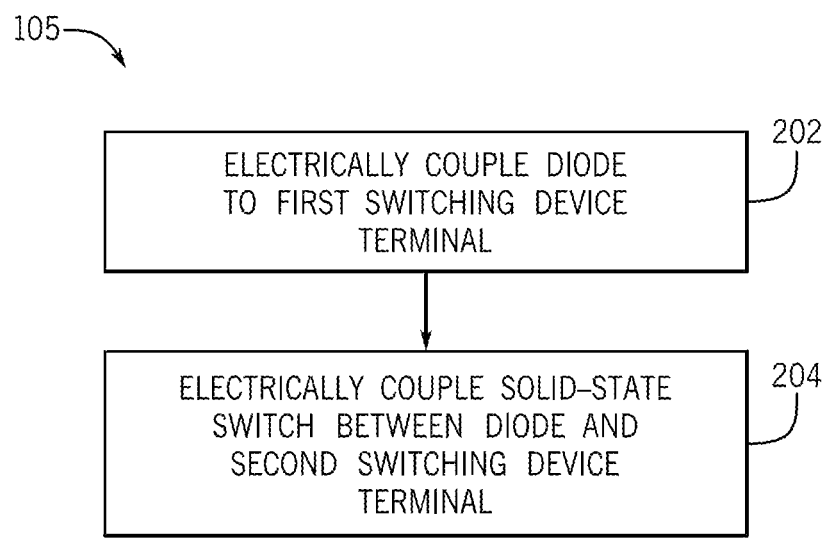
FIG. 9 is a flow diagram of a process for implementing the secondary switching device of FIG. 5, in accordance with an embodiment.

Returning to the process 100 of FIG. 6, as described above, the secondary switching device 56 may be implemented using a solid-state switching device 59 electrically coupled with a diode 60 (process block 104). For example, the secondary switching device 56 may be implemented using a solid-state switching device 59 shown in FIG. 5. Thus, an example of a process 105 for implementing a solid-state switching device 59 (e.g., as a secondary switching device 56 or a standalone switching device) is described in FIG. 9. Generally, the process 105 includes coupling a diode 60 to a first switching device terminal (process block 202) and electrically coupling a solid-state switch 59 between the diode 60 and a second switching device terminal (process block 204). In some embodiments, the process 105 may be implemented at least in part by a manufacturer of the battery system 12 and/or by a system integrator of the electrical system 36.

Figure 10:
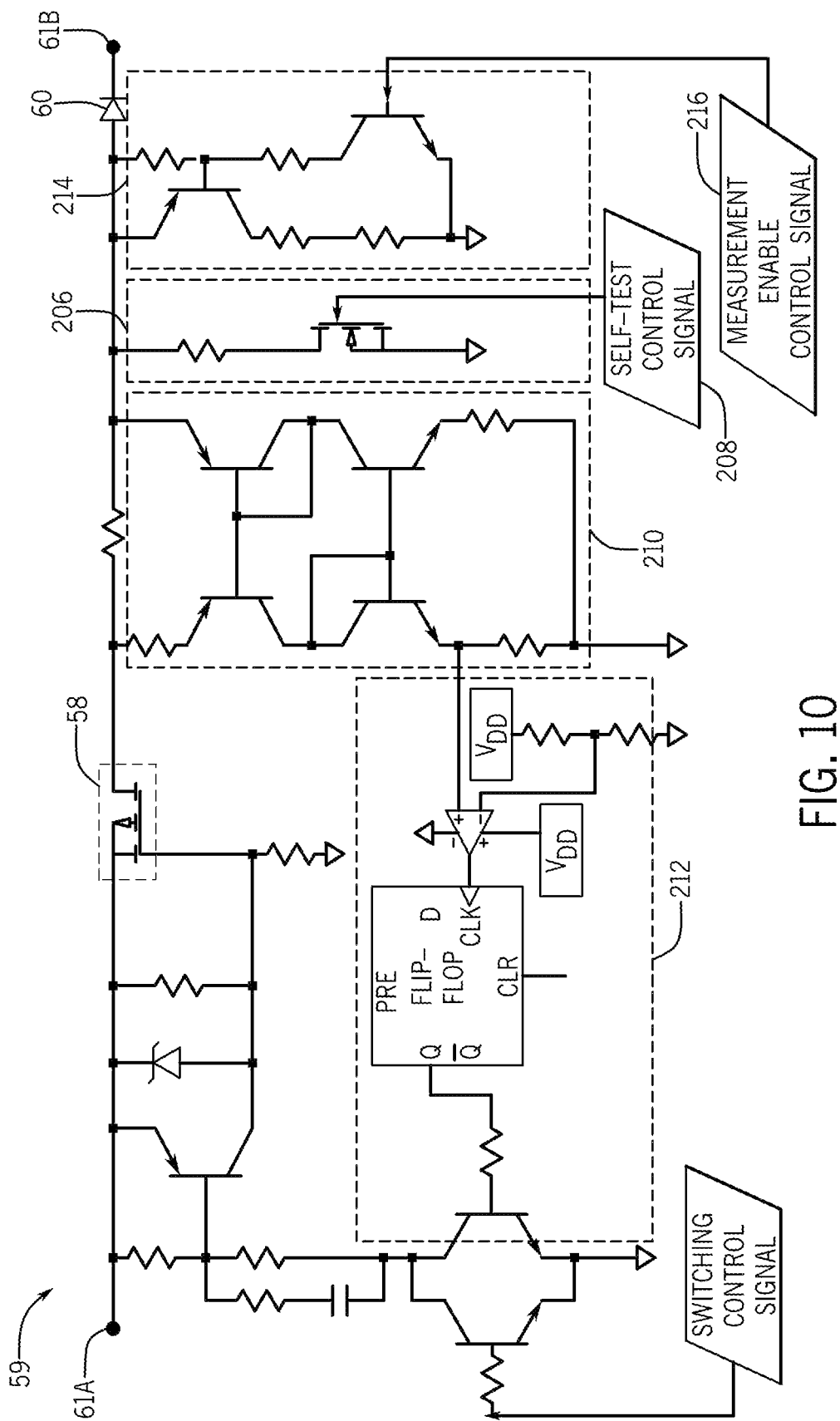
FIG. 10 is a another schematic diagram of the secondary switching device of FIG. 3, in accordance with an embodiment.

To facilitate improving operational efficiency and/or operational reliability, in some embodiments a solid-state switching device 59 may include additional circuitry. To help illustrate, another example of a solid-state switching device 59, which may be implemented as the secondary switching device 56 or a standalone switching device, is shown in FIG. 10. As depicted, the solid-state switching device 59 includes a current mirror branch 210, a self-test branch 206, and a voltage measurement branch 214 electrically coupled between the solid-state switch 58 and the diode 60. Additionally, the solid-state switching device 59 includes short circuit protection circuitry 212 electrically coupled between the current mirror branch 210 and a gate of the solid-state switch 58.

In some embodiments, a self-test branch 206 may receive a self-test control signal 208 that may cause it to try and force a short. This current may be replicated in a current mirror 210, which includes a resistor across which the replicated current may flow. The resulting voltage may be fed into the short circuit protection circuitry 212 where it is compared against a threshold voltage. If short circuit conditions are met, the battery 40 may be disconnected from the electrical system 36 and a clock signal originating from the short circuit protection circuitry 212 may be supplied to the hibernating processor 28 in a battery control system 14 causing it to wake up. A tighter comparison may be done by the processor 28 by sending a signal 216 to a voltage measurement branch circuit 214 that facilitates determining the battery 40 voltage. In this manner, the solid-state switching device 59 may facilitate reducing energy consumption by using a detection circuit to facilitate autonomously determining whether a short circuit condition is present and disconnecting the battery 40 in the electrical system 36 when the short circuit condition is expected to occur, for example, without waking the energy consuming processor 28.

Figure 11:
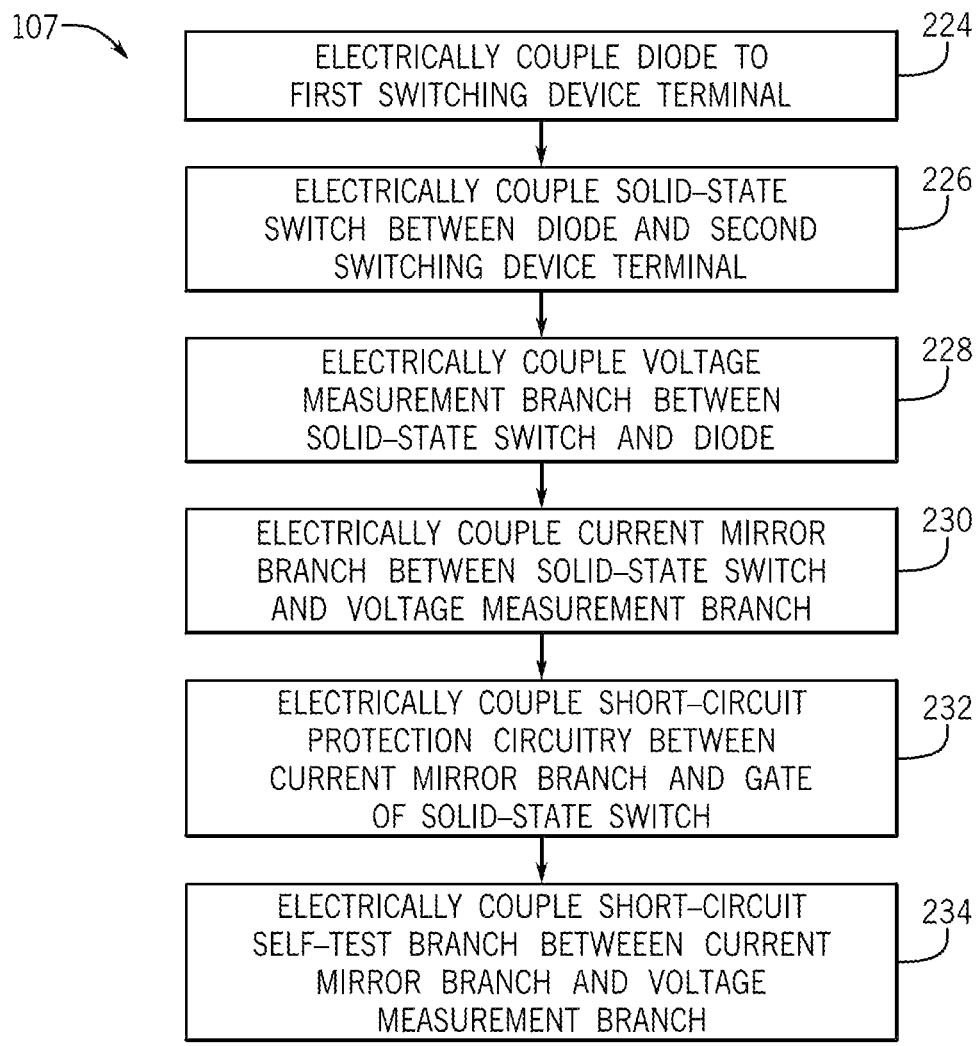
FIG. 11 is a flow diagram of a process for implementing the secondary switching device of FIG. 10, in accordance with an embodiment.

Another example of a process 107 for implementing a solid-state switching device 59 (e.g., as a secondary switching device 56 or a standalone switching device) is described in FIG. 11. Generally, the process 107 includes electrically coupling a diode 60 to a first switching device terminal (process block 224), electrically coupling a solid-state switch 58 between the diode 60 and a second switching device 56 terminal (process block 226), electrically coupling a voltage measurement branch 214 between the solid-state switching 58 and the diode 60 (process block 228), electrically coupling a current mirror branch 210 between the solid-state switch 58 and the voltage measurement branch 214 (process block 230), electrically coupling short-circuit protection circuitry 212 between the current mirror 210 and a gate of the solid-state switch 58 (process block 232), and electrically coupling the self-test branch 206 between the current mirror branch 210 and the voltage measurement branch 214 (process block 234). In some embodiments, the process 107 may be implemented at least in part by a manufacturer of the battery system 12 and/or by a system integrator of the electrical system 36.

Returning to the process 100 of FIG. 6, the primary switching device 42 and the secondary switching device 56 may be electrically coupled in parallel between terminals of the battery 40 (process block 106). For example, the primary switching device 42 may be coupled in parallel with the secondary switching device 54 at, and external to, the positive terminal of the battery 40. In some embodiments, coupling may occur internally or externally to the battery module 16. Furthermore, coupling may be done at either the positive terminal or negative terminal. Upon implementation of the battery system 12, the battery system 12 may facilitate improving operational efficiency and/or operational, reliability of the electrical system 36.

Figure 12:
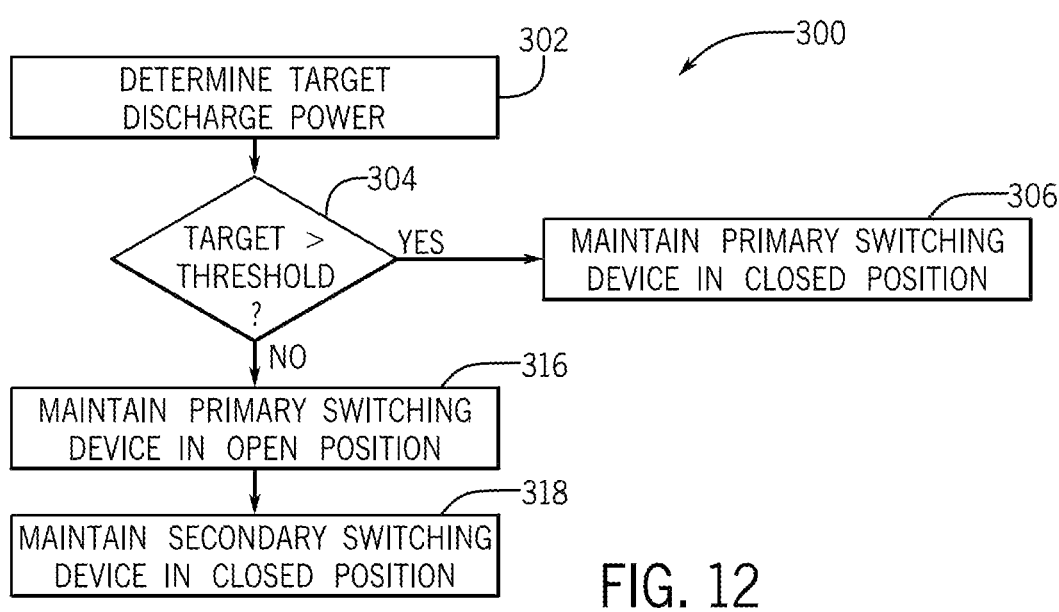
FIG. 12 is a flow diagram of a process for operating the electrical system of FIG. 2, in accordance with, an embodiment.

To help illustrate, an example of a process 300 for operating a battery system is described in FIG. 12. Generally, the process 300 includes determining how a target discharge power (process block 302), determining whether the target discharge power is greater than a power threshold (decision block 304), and maintaining a primary switching device 42 in a closed position when the target discharge power is greater than the power threshold (process block 306). When the target discharge power is not greater than the power threshold, the process 300 includes maintaining the primary switching device 42 in an open position (process block 316) and maintaining a secondary switching device 56 in a closed position (process block 318). In some embodiments, the process 300 may be implemented at least in part by executing instructions stored in a tangible, non-transitory, computer-readable medium, such as the memory 30, using processing circuitry, such as the processor 28.

Thus, in some embodiments, the battery control system 14 may determine target discharge power (e.g., current and/or voltage) (process block 302). In some embodiments, the target discharge power may be determined based on the power requirements of an electrically coupled electrical device 38. Additionally or alternatively, the target discharge power may be indicated by a higher-level control system (e.g., vehicle control system 36). In this manner, the target discharge current may vary between operations.

The target discharge power may compared to a power threshold (process block 304). In some embodiments, the power threshold may be predetermined and stored in a tangible, non-transitory, computer-readable medium, such as the memory 30. Thus, in such embodiments, the battery management system may retrieve the power threshold from the tangible, non-transitory, computer-readable medium and compare the power threshold with the target discharge power. Additionally, in some embodiments, the power threshold may be set based at least in part on the power capabilities (e.g., rating) of the secondary switching device 56, for example, such that the power threshold is greater than the power capabilities of the secondary switching device 56.

Thus, when the target discharge power is greater than the power threshold, the battery control system 14 may instruct the primary switching device 42 to maintain a closed position (process block 306). A closed primary switching device 42 may allow for higher magnitude current to flow between the battery 40 and the electrical device 38 when desired (e.g., to crank an internal combustion engine). In some embodiments, the secondary switching device 56 may also be maintained in a closed position.

Figure 13:
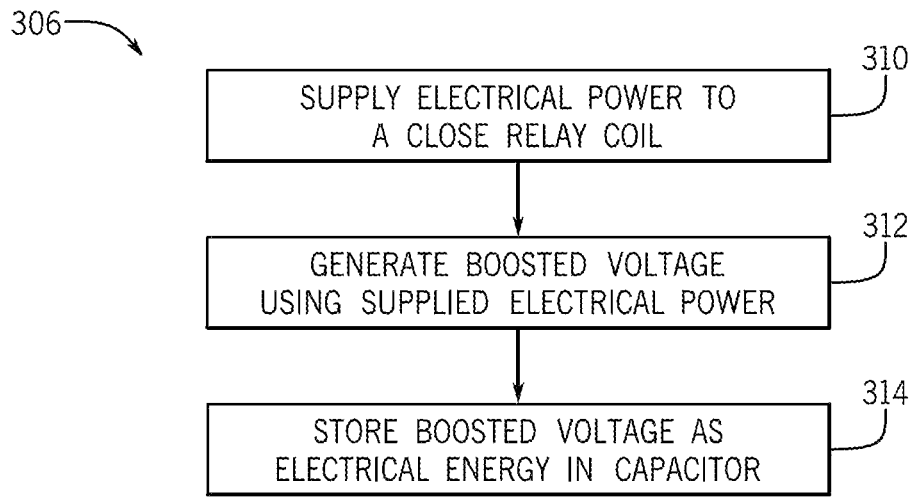
FIG. 13 is a flow diagram of a process for operating the coil circuitry of FIG. 7, in accordance with an embodiment.

An example of a process 306 for operating an electromechanical switching device 43 (e.g., implemented as the primary switching device 42 or a standalone switching device) is describe in FIG. 13. Generally, the process 306 includes supplying electrical power to a close relay coil (process block 310), generating a boost voltage using the supplied electrical power (process block 312), and storing boosted voltage as electrical energy in a capacitor 142 (process block 314). In some embodiments, the process 306 may be implemented at least in part by executing instructions stored in a tangible, non-transitory, computer-readable medium, such as the memory 30, using processing circuitry, such as the processor 28.

Thus, in some embodiments, a battery control system 14 may instruct a battery system 12 to supply electrical power to a close relay coil (process block 310). Appropriate high-side close 114 and low-side close 120 signals may be received to allow current to flow through the close relay coil 50A, creating a magnetic field that may cause the contactors 46 and 52 to close. For example, a high signal to the high-side close transistor 118 may allow for the contactor to switch to or maintain the closed position while a low signal to the low-side close transistor 122 may increase the amount of time required to open the contactors 46 and 52 after they have been in the closed position. Thus the low-side circuitry of a relay may be used to actuate an armature 44 while the high-side circuitry may be useful in powering electrical loads.

The magnetic field generated by the electrical power may be supplied to the close relay coil 50A may create boosted voltage that can be used by the electrical system 36 (process block 312). Electrical energy may be stored within the magnetic field when high-side signals are applied to the high-side close transistor 118. When the signal is removed, the close relay coil's magnetic field collapses, producing a back voltage that adds to, and thereby steps up, the voltage available to the load. The resulting boosted voltage can be preserved for later use.

The boosted voltage may be stored in a capacitor 142 as electrical energy, increasing the reliability and performance of the electrical system 36. The stepped up voltage produced by the close relay coil's magnetic field collapse may forward bias the diode 140 allowing current flow through the diode and to the capacitor 142. The current causes the capacitor 142 to charge, thereby storing the boosted voltage as electrical energy for later use. For example, during a short circuit condition, the battery 40 voltage may drop such that it is insufficient to actuate the armature 44. The boosted voltage stored in the capacitor 142 may instead actuate the armature 44 by acting as the source for the high-side open transistor 134. The contacts 46 and 52 are disconnected, thereby preventing battery 40 drain. Furthermore, the size of the capacitor 112 and/or the leaking (e.g., quiescent) current through the capacitor may be reduced, increasing the shelf-life of the battery 40. The boosted voltage can thereby increase the operational reliability and performance of the electrical system 36.

Returning to the process 300 of FIG. 12, the battery control system 14 may instruct the battery system 12 to maintain the primary switching device 42 in an open position when the target discharge current is not greater than the threshold current (process block 316). This configuration may provide benefits during sleep mode. For example, a large magnitude of current is not drawn when lower magnitude of current flow between the electrical device 38 and battery 40 may be sufficient (e.g., powering a radio during vehicle key off mode). Power consumption is thereby reduced and the life span of the battery is improved.

Figure 14:
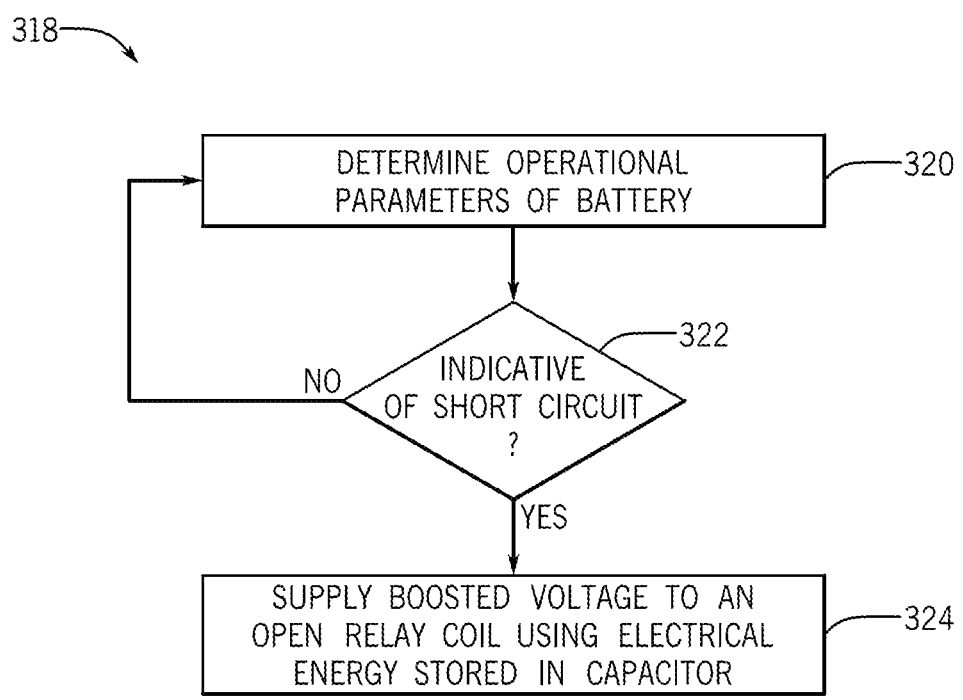
FIG. 14 is a flow diagram of another process for operating the coil circuitry of FIG. 7, in accordance with an embodiment.

Additionally, the battery control system 14 may instruct the battery system 12 to maintain the secondary switching device 56 in a closed position (process block 318). An example of process 318 for operating a solid-state switching device 59 (e.g., implemented as a secondary switching device 56 or a standalone switching device) is described in FIG. 14. Generally, the process 318 includes determining operational parameters of a battery 50 (process block 320), determining whether the operational parameters are indicative of a short-circuit (decision block 322), and supplying a boosted voltage to an open relay coil 50B using electrical power stored in a capacitor when the operational parameters are indicative of a short-circuit (decision block 324). In some embodiments, the process 318 may be implemented at least in part by executing instructions stored in a tangible, non-transitory, computer-readable medium, such as the memory 30, using processing circuitry, such as the processor 28.

Thus, in some embodiments, the battery control system 14 may determine operational parameters of a battery 40 (process block 320). A battery control system 14 may receive and interpret sensor data to evaluate battery parameters, for example, voltage, current, and temperature. For example, the secondary switching device 56 may include a voltage measurement branch 214 that facilitates determining battery voltage.

In some embodiments, the boosted voltage may be used to actuate a relay coil 138 (process block 324). As the primary switching device 42 is open and the second switching device 56 is closed, the electrical system 36 is in key off mode. A self-test branch circuit 206 may automatically force a short through hardware to detect whether short circuit conditions are present. If indicative of a short circuit, a signal may be fed to the short circuit protection circuitry 212 causing the boosted voltage stored in the primary switching device 42 to be supplied to the open relay coil 50B, thereby opening the primary switching device 42. A signal may then be sent to the hibernating processor 28 to awaken it. The processor 28 may conduct further tests on the battery voltage using the voltage measurement branch 214 to make tighter evaluations on whether a short circuit condition is present.

Parallel switching devices may be used in electrical systems 36, particularly those including battery systems 12, to increase operational performance and reliability. An electromechanical switch may be used to close or open contacts 46 and 52 and to also generate a boosted voltage. A secondary switching device 56 may be used to detect short circuit conditions which can reduce battery performance. The secondary switching device 56 may also use the boosted voltage to remove the short circuit condition. This may be done without waking the processor 28 and thus reduces power consumption. Further, the parallel switching devices may work together to deliver the appropriate amount of power required by an electrical device 38 without loading the battery 40.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. An automotive vehicle comprising:
   a battery cell;
   circuitry including a primary switching device electrically coupled to a terminal of the battery cell, the primary switching device comprising an electromechanical switching device configured to, when in a first closed position:
   enable current in a first direction through the primary switching device to facilitate charging the battery cell; and
   enable current in a second direction through the primary switching device to facilitate discharging the battery cell; and
   the circuitry further including a secondary switching device electrically coupled to the terminal of the battery cell in parallel with the primary switching device, the secondary switching device comprising:
   a solid-state switching device; and
   a diode electrically coupled in series with the solid-state switching device, the diode being configured to enable current in only one of the first direction and the second direction through the secondary switching device when the solid-state switching device is in a second closed position; and a battery control system operatively coupled to the secondary switching device to test operation of the circuitry, the battery control system being configured to
determine target current to be supplied from the battery cell to an electrical device electrically coupled to the primary switching device and the secondary switching device; and
when the target current is less than a first current threshold:
instruct the solid-state switching device to maintain the second closed position to facilitate supplying electrical power at the target current from the battery cell to the electrical device; and
instruct the electromechanical switching device to maintain a first open position to facilitate limiting supply of electrical power to the electrical device.

2. The automotive vehicle of claim 1, wherein the electromechanical switching device comprises;
a first relay coil electrically coupled to a capacitor, wherein the first relay coil is configured to, when electrical power at a battery voltage is received:
generate a first magnetic field that facilitates transitioning the electromechanical switching device from a first open position to the first closed position; and
facilitate boosting the battery voltage to a boosted voltage to be stored in the capacitor.

3. The automotive vehicle of claim 2, which includes a second relay coil configured to generate a second magnetic field that facilitates transitioning the electromechanical switching device from the first closed position to the first open position when electrical power at the boosted voltage is supplied from the capacitor to the second relay coil.

4. The automotive vehicle of claim 1, wherein the secondary switching device comprises:
a current mirror branch electrically coupled between the solid-state switching device and the diode; and
short-circuit protection circuitry electrically coupled between the current mirror branch and a gate of the solid-state switching device, wherein the short-circuit protection circuitry is configured to:
determine when a short-circuit condition is expected to be present based at least in part on current through the current mirror branch; and
when the short-circuit condition is expected to be present:
instruct the solid-state switching device to transition from the second closed position to a second open position; and
output a clock signal to wake-up the battery control system to enable the battery control system to confirm whether the short-circuit condition is actually present.

5. The automotive vehicle of claim 1, wherein the battery control system is configured to:
instruct the electromechanical switching device to maintain the first closed position when the target current is not less than the first current threshold;
instruct the solid-state switching device to maintain a second open position when the target current is less than a second current threshold greater than the first current threshold to facilitate limiting supply of electrical power to the electrical device; and
instruct the solid-state switching device to maintain the second closed position when the target current is not less than the second current threshold to facilitate supplying electrical power at the target current from the battery cell to the electrical device.

6. The automotive vehicle of claim 1, wherein the battery cell is one of a plurality of battery cells comprising a battery module.

7. A method comprising:
operating an automotive vehicle including a battery cell and circuitry including an electromechanical switching device coupled to a terminal of the battery cell and a semiconductor switching device coupled to the terminal of the battery cell in parallel with the electromechanical switching device;
enabling current in a first direction through the electromechanical switching device to discharge the battery cell;
enabling current in a second direction through the electromechanical switching device to charge the battery cell;
limiting current through a solid-state switching device in one of the first direction and the second direction with a diode electrically coupled in series with the solid-state switching device when the solid-state switching device is in closed position;
testing operation of the circuitry with a battery control system operatively coupled to the solid-state switching device;
determining a target power output from the battery cell;
maintaining an open position of the electromechanical switching device when the target power is less than or equal to a power threshold; and
if the target power exceeds the power threshold, maintaining a closed position of the electromechanical switching device.

8. The method of claim 7, which comprises storing electrical energy at a boosted voltage with a capacitor.

9. The method of claim 7, which comprises providing electric power to a vehicle electrical system through the solid-state switching device while the electromechanical switching device is in an open state.

10. The method claim 9, which includes deploying the battery cell and circuitry in an automotive vehicle.

11. The method of claim 7, wherein the testing includes evaluating ability of the circuitry to detect a short-circuit condition.

12. The method of claim 7, which further includes maintaining the closed position of the solid-state switching device.

13. An apparatus comprising:
a battery;
circuitry including a primary switching circuit electrically coupled to a terminal of the battery, the primary switching circuit comprising, an electromechanical switching device configured to, when in a first closed position, enable current in a first direction through the primary switching circuit to facilitate charging the battery, and enable current in a second direction through the primary switching circuit to facilitate discharging the battery; and
the circuitry further including a secondary switching circuit electrically coupled to the terminal of the battery in parallel with the primary switching circuit, the secondary switching circuit comprising solid-state switching devices being configured to enable current in only one of the first direction and the second direction through the secondary switching devices when the secondary switching circuit is in a closed configuration; and
a battery control system operatively coupled to the primary switching circuit and the secondary switching circuit to test, operation of the circuitry, the battery control system being configured to determine target current to be supplied from the battery to an electrical device electrically coupled to the primary switching device and the secondary switching device, and when the target current is less than a first current threshold:
instruct the secondary switching circuit to maintain the closed configuration to facilitate supplying electrical power at the target current from the battery to the electrical device; and
instruct the electromechanical switching device to maintain a first open position to facilitate limiting supply of electrical power to the electrical device.

14. The apparatus of claim 13, wherein the electromechanical switching device comprises:
a first relay coil electrically coupled to a capacitor, wherein the first relay coil is configured to, when electrical power at a battery voltage is received:
generate a first magnetic field that facilitates transitioning the electromechanical switching device from a first open position to the first closed position; and
facilitate boosting the battery voltage to a boosted voltage to be stored in the capacitor.

15. The apparatus of claim 14, which includes a second relay coil configured to generate a second magnetic field that facilitates transitioning the electromechanical switching device from the first closed position to the first open position when electrical power at the boosted voltage is supplied from the capacitor to the second relay coil.

16. The apparatus of claim 13, wherein the secondary switching circuit comprises:
a solid-state switching device and a diode;
a current mirror branch electrically coupled between the solid-state switching device and the diode; and
short-circuit protection circuitry electrically coupled between the current mirror branch and a gate of the solid-state switching device, the short-circuit protection circuitry being configured to:
determine when a short-circuit condition is expected to be present based at least in part on current through the current mirror branch; and
when the short-circuit condition is expected to be present:
instruct the secondary switching circuit to transition from the closed configuration to an open configuration; and
output a clock signal to wake-up the battery control system to enable the battery control system to confirm whether the short-circuit condition is actually present.

17. The apparatus of claim 13, wherein the battery control system is configured to:
instruct the electromechanical switching device to maintain the first closed position when the target current is not less than the first current threshold;
instruct the secondary switching circuit to maintain an open configuration when the target current is less than a second current threshold greater than the first current threshold to facilitate limiting supply of electrical power to the electrical device; and
instruct the secondary switching circuit to maintain the closed configuration when the target current is not less than the second current threshold to facilitate supplying electrical power at the target current from the battery to the electrical device.

18. The apparatus of claim 13, wherein the battery is one of a plurality of battery cells comprising a battery module.

* * * * *